US006077641A

United States Patent [19]

Parsons et al.

[11] Patent Number: 6,077,641

[45] Date of Patent: Jun. 20, 2000

[54] LITHOGRAPHIC PLATES

[75] Inventors: Gareth R. Parsons, Leeds; Alan S. V. Monk, Warrington, both of United Kingdom; Eduard Kottmair, Ebenhausen, Germany

[73] Assignee: Kodak Polychrome Graphics LLC, Norwalk, Conn.

[21] Appl. No.: 09/354,044

[22] Filed: Jul. 15, 1999

Related U.S. Application Data

[63] Continuation of application No. PCT/GB98/00132, Jan. 15, 1998.

[30] Foreign Application Priority Data

Jan. 17, 1997 [GB] United Kingdom .................. 9700877

[51] Int. Cl.$^7$ .................................................. G03F 7/021

[52] U.S. Cl. ...................... 430/157; 430/271.1; 430/926; 430/927

[58] Field of Search ................................ 430/157, 271.1, 430/926, 927

[56] References Cited

U.S. PATENT DOCUMENTS

| | | | |
|---|---|---|---|
| 5,151,340 | 9/1992 | Tadros | 430/192 |
| 5,296,332 | 3/1994 | Sachdev et al. | 430/270 |
| 5,340,699 | 8/1994 | Haley et al. | 430/302 |
| 5,372,907 | 12/1994 | Haley et al. | 430/157 |
| 5,372,915 | 12/1994 | Haley et al. | 430/302 |
| 5,527,659 | 6/1996 | Yamaoka et al. | 430/179 |
| 5,932,392 | 8/1999 | Hirai et al. | 430/270.1 |
| 6,013,412 | 1/2000 | Aoshima | 430/270.1 |

FOREIGN PATENT DOCUMENTS

| | | |
|---|---|---|
| 0 613 050 B1 | 8/1994 | European Pat. Off. . |
| 0 625 728 A2 | 11/1994 | European Pat. Off. . |
| 0 626 273 B1 | 11/1994 | European Pat. Off. . |
| WO 88/02878 | 4/1988 | WIPO . |

*Primary Examiner*—John S. Chu
*Attorney, Agent, or Firm*—Ratner & Prestia

[57] ABSTRACT

A lithographic printing plate precursor comprising on a support a radiation sensitive composition which comprises (1) a novolac resin, (2) a condensing agent for the novolac resin which is either a methylol polyvinyl phenol compound or a bishydroxymethyl compound, (3) a radiation sensitive latent acid generating compound, and (4) an infra-red sensitizing dye.

11 Claims, No Drawings

LITHOGRAPHIC PLATES

This application is a continuation of PCT International Application PCT/GB98/00132, international filing date Jan. 15, 1998.

This invention relates in particular to radiation sensitive lithographic plates which can be used in a computer-to-plate process but which also can be imagewise exposed through a photographic mask to U.V. light.

A number of such plates have been described in prior published patent applications but when we have tested the proposed compositions they have been found to be unstable or not fast enough for computer-to-plate use. Other proposed compositions are difficult to prepare or use unacceptable solvents, some require two exposures one a laser exposure and the other an overall U.V. exposure. Two separate exposures are not welcomed by commercial printers.

However, one composition which would seem to meet all the requirements is described in E.P.A 625728. The composition described in this application comprises 1 a novolac resin, 2 a resole resin, 3 a latent Bronsted acid and an infra-red absorber.

We have devised an alternative system which does not require the presence of both a resole resin and a novolac resin in the composition.

Therefore according to the present invention there is provided a lithographic printing plate precursor comprising on a support a radiation sensitive composition which comprises (1) a novolac resin, (2) a condensing agent for the novolac resin which is either a methylol polyvinyl phenol compound or a bis hydroxymethyl compound, (3) a radiation sensitive latent acid generating compound and (4) an infra-red absorbing compound or an infra-red sensitising dye.

For example the novolac resins derived from m-cresol and formaldehyde are useful.

A particularly suitable bis hydroxymethyl condensing agent is 2,6-bis(hydroxymethyl)-p-cresol.

A particularly suitable methylol polyvinyl phenol compound is a copolymer of the following structure:

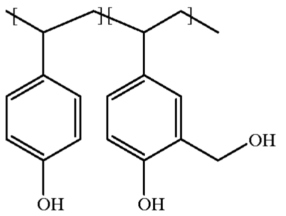

Suitable latent acid generating compounds are latent Bronsted acids and haloalkyl-substituted-s-triszines.

Other examples of latent Bronsted acid generators are iodonium, sulphonium, phosphonium selenonium, diazonium and arsonium salts and particularly salts of fluorophosphoric acid.

If a haloalkyl-substituted-s-triazine is used. as the latent acid generating compound preferably it is of the formula:

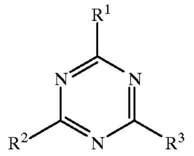

wherein $R^1$ is a substituted or unsubstituted aliphatic or aromatic group, $R^2$ and $R^3$ are each a trihaloalkyl group.

A particularly useful diazonium salt for use as an acid generator (acid generator A) is the compound of formula:

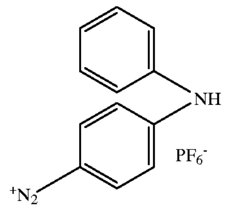

The above mentioned latent Bronsted acids with the exception of diazonium salts are all decomposed by both UV and infra-red light to liberate an acid.

Diazonium salts are decomposed by U.V. light to liberate an acid but as diazonium salts can not be light-sensitised they are not decomposed by infra-red light. However, if an infra-red absorber is present in the composition which converts infra-red light to heat then the diazonium salts which are heat sensitive are decomposed as in the examples which follow.

Carbon black is a useful infra-red absorbing agent which converts infra-red radiation to heat. Other pigments can also be used.

Examples of useful infra-red sensitising dyes are dyes of the following classes, squarylium, croconate, cyanine, merocyanine, indolizine, pyrylinium or a metal dithiolene dye.

The composition of the present invention is of particular use because it can be UV imaged in the normal manner using a mask or it can be imaged by a laser digitally. Also negative plates or direct positive plates can be prepared.

According to another aspect of the present invention there is provided a method of preparing a lithographic printing plate which comprises infra-red laser imaging a lithographic printing plate precursor as just set forth, heating the imaged plate overall and then subjecting the heated plate to development in an aqueous alkali solution to yield a negative working plate.

Preferably the infra-red absorbing compound is one whose absorption spectrum is significant at the wavelength output of the laser which is to be used in the method of the present invention. For example gallium arsenide diode lasers emit at 830 nm and Nd YAG lasers emit at 1064 nm.

In the method of the present invention the laser imaging of the plate followed by heat treatment hardens the composition imagewise. The unexposed composition on the plate is removed by the development step. This yields a negative image.

However, the lithographic plate precursor of the present invention can be used to produce a direct positive plate. In this method the plate is imagewise exposed through a mask to U.V. light or directly using a laser then developed. In this case the exposed areas become alkali-soluble leaving the unexposed areas as the direct positive image.

Preferably in the lithographic assembly used in the method of the present invention where heat is generated by the infra-red laser there is present between the photosensitive layer and the base a heat insulator layer which attenuates the thermal conductivity to the base. This is especially useful if the base is an aluminium plate base. In the preparation of an aluminium plate base for use in lithography there usually forms on the base a thin layer of aluminium oxide which is often between 2 to 3 microns in thickness. However, in some method of preparing the base a layer of aluminium oxide is formed which is from 10 to 15 microns in thickness. Such a thickness of aluminium oxide acts very efficiently as a heat insulation layer. However, if the thickness of the aluminium oxide layer is much greater than 15 microns an unstable layer can be formed which tends to flake off.

Thermal conduction from the imaging layer may also be reduced by optimisation of anodising conditions to produce an anodic sub-layer of low porosity and low thermal conductivity.

Thermal conduction from the imaging layer may also be reduced by use of hydrophilising layers such as those described in E.P.A. 626273.

Preferably as much infra-red absorber is present in the photosensitive composition so as not to interfere with the alternative U.V. exposure method. Dyes with the selective IR absorption can be present in a greater amount than a black body such as carbon.

By having a thermal insulating layer and by varying the amount of infra-red absorber present in the photosensitive composition it is possible to minimise the loss of resolution through lateral heat conductivity whilst maintaining sufficient sensitivity.

The base which can be used as a lithographic base is preferably an aluminium plate which has undergone the usual anodic, graining and post-anodic treatments well known in the lithographic art for enabling a photosensitive composition to be coated thereon.

Another base material which may be used in the method of the present invention is a plastics material base or a treated paper base as used in the photographic industry. A particularly useful plastics material base is polyethylene terephthalate which has been subbed to render its surface hydrophilic. A so-called resin coated paper which has been corona discharge treated may also be used.

An example of a suitable practical developing solution is an aqueous solution of 8% metasilicate, 0.1% of an organic phosphate ester of an ethoxylated alcohol and 0.01% of polyoxylpropylane methyl ethyl ammonium chloride.

LASER IMAGING

The coated substrate to be imaged was cut into a circle of 105 mm diameter and placed on a disc that could be rotated at a constant speed of 2500 revolutions per minute. Adjacent to the spinning disc a translating table held the source of the laser beam so that the laser beam impinged normal to the coated substrate, while the translating table moved the laser beam radially in a linear fashion with respect to the spinning disk. The exposed image was in the form of a spiral whereby the image in the centre of the spiral represented slow laser scanning speed and long exposure time and the outer edge of the spiral represented fast scanning speed and short exposure time.

The laser used was a single mode 830 nm wavelength 200 mW laser diode which was focused to a 10 micron spot. The laser power supply was a stabilised constant current source.

PROCESSING AFTER IMAGING

The exposed disc was developed by immersing in the alkaline developer solution which removed the non-imaged coating leaving the exposed spiral image. The larger the diameter of the resulting spiral image corresponded to the less exposure time required to form the image. Exposure time quoted in the examples was the calculated time required for the laser to pass over a theoretical 10 micron square on the surface of the substrate and corresponded to an exposure sufficient to produce an image line that resisted the developer treatment.

CONVENTIONAL IMAGING

It is to be understood, that the precursors prepared in the present invention can also be U.V. imaged to yield a positive working plate or can be reversal imaged to yield a negative working plate. The U.V. source may be a carbon arc lamp, a mercury vapour lamp, a fluorescent lamp or a tungsten filament lamp.

DEVELOPERS

Different coatings had different alkali solubility and required different developer compositions. Below are the basic compositions of three developers two of which are used in the examples.

Developer A

3% Sodium Metasilicate pentahydrate in water.

Developer B

7% Sodium Metasilicate pentahydrate in water.

Developer C

14% Sodium Metasilicate pentahydrate in water.

The imaged substrate was developed for 30 seconds.

MATERIALS

The following substances were used in the examples which follow In the Example which follows the condensing agent was polyvinyl phenol with substituted methylol groups

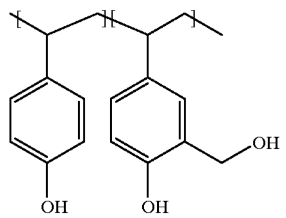

One resin used was a phenol/cresol novolac (novolac A)

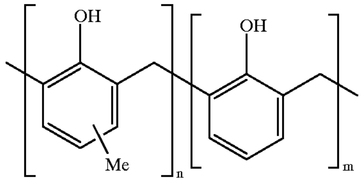

*m*/*n* = equal

Another resin used was a Cresol novolac resin (novolac B)

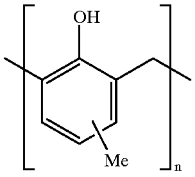

The latent acid generating compounds were:

Acid generator A

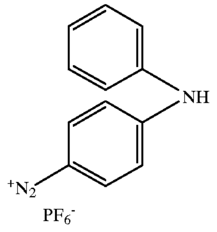

Acid generator B

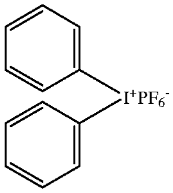

Acid generator C

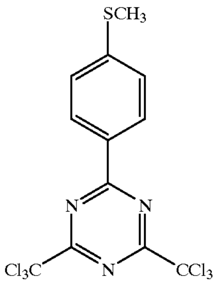

and the IR sensitising dye A:

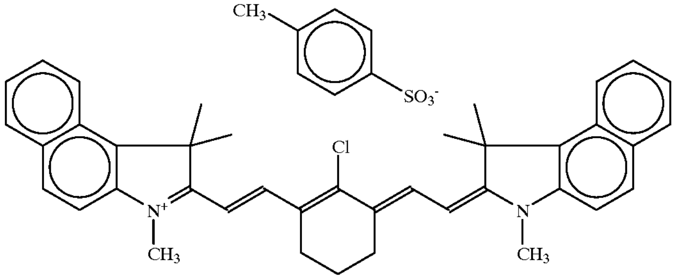

One of the solvents used in the following examples is dimethyl formamide (DMF)

EXAMPLE 1

A solution containing 0.59 g of 40% w/w novolak A in methoxypropanol, 0.24 g polyvinyl phenol substituted with methylol groups, 0.055 g of acid generate or B, 0.22 g of dye A, 3.09 g of methoxypropanol and 1 g of DMF was prepared and coated onto a substrate consisting of a sheet of aluminium that had been electrograined and anodised, giving a coating weight of 1.3 $gm^{-2}$ after thoroughly drying at 100° C. in an oven for 3 minutes.

| COMPONENT | WEIGHT (g) | % SOLIDS |
|---|---|---|
| Novalak A | 0.59 | 42 |
| Methylol-P.V.Phenol | 0.59 | 42 |
| Acid generator B | 0.55 | 12 |
| Dye A | 0.022 | 4 |
| Methoxypropanol | 3.09 | 0 |
| DMF | 1 | 0 |

The resulting plate was imaged using a 200 mW laser diode at a wavelength of 830 nm using the imaging device described previously. The plate was then heated to 130° C. for one minute. The plate was then developed using the alkaline developer B for 30 seconds which removed the parts of the coating on the plate that were not struck by the laser beam giving an image. The imaging energy density required to give a suitable image was 200 $mJ/cm^{-2}$ using developer B.

EXAMPLE 2

A solution containing 0.59 g of 40% w/w novolak A in methoxypropanol, 0.24 g polyvinyl phenol substituted with hydroxymethyl groups, 0.055 g of acid generator A, 0.22 g of dye A, 3.09 g of methoxypropanol and 1 g of DMF was prepared and coated onto a substrate consisting of a sheet of aluminium that had been electrograined and anodised, giving a coating weight of 1.3 $gm^{-2}$ after thoroughly drying at 100° C. in an oven for 3 minutes.

| COMPONENT | WEIGHT (g) | % SOLIDS |
|---|---|---|
| novolak A | 0.59 | 42 |
| methylol-P.V.Phenol | 0.24 | 42 |
| acid generator A | 0.02 | 12 |
| dye A | 0.022 | 4 |
| methoxypropanol | 3.09 | 0 |
| DMF | 1 | 0 |

The resulting plate was imaged using a 200 mW laser diode at a wavelength of 830 nm using the imaging device described previously. The plate was then heated to 100° C. for one minute. The plate was then developed using the alkaline developer B for 120 seconds which removed the parts of the coating on the plate that were not struck by the laser beam giving an image. The imaging energy density required to give a suitable image was 200 $mJ/cm^{-2}$ using developer B.

EXAMPLE 3

A solution containing 1.18 g of 40% w/w novolak B in methoxypropanol, 0.55 g bis(hydroxymethyl)p-cresol, 0.055 g of acid generator B 0.22 g of dye A, 272 g of methoxypropanol and 1 g of DMF was prepared and coated onto a substrate consisting of a sheet of aluminium that had been electrograined and anodised, giving a coating weight of 1.3 $gm^{-2}$ after thoroughly drying at 100° C. in an oven for 3 minutes.

| COMPONENT | WEIGHT (g) | % SOLIDS |
|---|---|---|
| novolak B | 1.18 | 81.8 |
| bis(hydroxymethyl) p-cresol | 0.55 | 9.6 |
| acid generator B | 0.02 | 4.8 |
| dye A | 0.022 | 3.8 |
| methoxypropanol | 3.09 | 0 |
| DMF | 1 | 0 |

The resulting plate was imaged using a 200 mW laser diode at a wavelength of 830 nm using the imaging device described previously. The plate was then heated to 100° C. for one minute. The plate was then developed using the alkaline developer B for 120 seconds which removed the parts of the coating on the plate that were not struck by the laser beam giving an image. The imaging energy density required to give a suitable image was 200 $mJ/cm^{-2}$ using developer C.

EXAMPLE 4

A solution containing 1.18 g of 40% w/w novolak B in methoxypropanol, 0.55 g bis(hydroxymethyl)p-cresol, 0.055 g of acid generator A 0.22 g of dye A, 272 g of methoxypropanol and 1 g of DMF was prepared and coated onto a substrate consisting of a sheet of aluminium that had been electrograined and anodised, giving a coating weight of 1.3 $gm^{-2}$ after thoroughly drying at 100° C. in an oven for 3 minutes.

| COMPONENT | WEIGHT (g) | % SOLIDS |
|---|---|---|
| novalak B | 1.18 | 81.8 |
| bis(hydroxymethyl) p-cresol | 0.55 | 9.6 |
| acid generator A | 0.02 | 4.8 |
| dye A | 0.022 | 3.8 |
| methoxypropanol | 3.09 | 0 |
| DMF | 1 | 0 |

It is to be understood that a lithographic plate precursor as prepared in the examples could be imaged conventionally: a positive plate can be obtained by UV imaging and developing and a negative plate can be obtained by UV imaging, heating and developing.

As the precursor plates of the present invention rely on a heating process, any suitable light of sufficient power which is absorbed by components in the system to generate heat in the composition, and be used.

EXAMPLE 5

A solution containing 0.59 g of 40% w/w novolak A in methoxypropanol, 0.59 g of a 40% polyvinyl phenol (substituted with methylol groups) solution in methoxypropanol, 0.55 g of a 10% solution of acid generator C in DMF, 0.022 g of dye A, 1.5 g of methoxypropanol and 1.73 g of DMF was prepared and coated onto a substrate consisting of a sheet of aluminium that had been electrograined and anodised, giving a coating film weight of 1.3 $gm^{-2}$ after thoroughly drang at 100° C. in an oven for 3 minutes.

| COMPONENT | WEIGHT (g) | % SOLIDS |
|---|---|---|
| novolak A | 0.59 | 42 |
| methylol-P.V. phenol | 0.59 | 42 |
| acid generator C | 0.55 | 12 |
| dye A | 0.022 | 4 |
| Methoxypropanol | 1.51 | 0 |
| DMF | 1.73 | 0 |

The resulting plate was imaged using a 200 mW laser diode at a wavelength of 830 nm using the imaging device described previously. The plate was then heated to 100° C. for one minute. The plate was then developed using the alkaline developer C for 120 seconds which removed the parts of the coating on the plate that were not struck by the laser beam giving an image. The imaging energy density required to give a suitable image was 480 $mJ/cm^{-2}$ using developer B.

EXAMPLE 6

A solution containing 1.18 g of 40% w/w novolak B in methoxypropanol, 0.14 g of a 40% solution of bis (hydroxymethyl)p-cresol in methoxypropanol, 0.055 g of a 10% solution of acid generator C in DMF, 0.022 g of dye A, 1.42 g of methoxypropanol and 1.96 g of DMF was prepared and coated onto a substrate consisting of a sheet of aluminium that had been electrograined and anodised, giving a coating film weight of 1.3 $gm^{-2}$ after thoroughly drying at 100° C. in an oven for 3 minutes.

| COMPONENT | WEIGHT (g) | % SOLDS |
|---|---|---|
| Novolak B | 1.18 | 81.8 |
| bis(hydroxymethyl) p-cresol | 0.55 | 9.6 |
| acid generator C | 0.02 | 4.8 |
| dye A | 0.022 | 3.8 |
| Methoxypropanol | 3.09 | 0 |
| DMF | 1 | 0 |

The resulting plate was imaged using a 200 mW laser diode at a wavelength of 830 nm using the imaging device described previously. The plate was then heated to 100° C. for one minute. The plate was then developed using the alkaline developer C for 120 seconds which removed the parts of the coating on the plate that were not struck by the laser beam giving an image. The imaging energy density required to give a suitable image was 600 mJ/cm$^{-2}$ using developer B.

What is claimed is:

1. A lithographic printing plate precursor comprising on a support a radiation sensitive composition which comprises (1) a novolac resin, (2) a condensing agent for the novolac resin which is a either a methylol polyvinyl phenol compound or a bishydroxymethyl compound, (3) a radiation sensitive latent acid generating compound and (4) an infra red absorbing compound or an infra-red sensitising dye.

2. A lithographic printing plate precursor according to claim 1 wherein the novolac resin is derived from m-cresol and formaldehyde.

3. A lithographic printing plate precursor according to claim 1 wherein the bishydroxymethyl condensing agent is 2,6-bis(hydroxymethyl)-p-cresol.

4. A lithographic printing plate precursor according to claim 1 wherein the methylol polyvinyl phenol compound has the following structure:

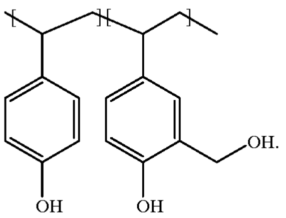

5. A lithographic printing plate precursor according to claim 1 wherein the radiation sensitive latent acid generating compound is a latent Bronsted acid or a haloalkyi-substituted s-triazine.

6. A lithographic printing plate precursor according to claim 5 wherein the latent acid generating compounds is an iodonium, sulphonium, phosphonium, selenonium, diazonium or arsonium salt, or fluorophosphoric acid.

7. A lithographic printing plate precursor according to claim 6 wherein the iodonium salt is iodonium hexafluorophospate.

8. A lithographic printing plate precursor according to claim 6 wherein the diazonium salt has the formula:

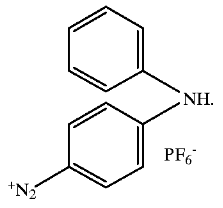

9. A lithographic printing plate precursor according to claim 5 wherein the haloalkyl-substituted-S-triazine is of the formula:

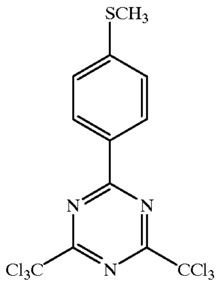

10. A lithographic printing plate precursor according to claim 1 wherein the infra-red absorbing compound is carbon black.

11. A lithographic plate precursor according to claim 1 wherein the infra-red sensitising dye is a dye of one of the following classes of dye:

squarylium, croconate, cyanine, merocyanine, indolizine, pyrylinium or metal dithiolene dye.

* * * * *